(12) United States Patent
Sheu et al.

(10) Patent No.: US 6,368,910 B1
(45) Date of Patent: Apr. 9, 2002

(54) METHOD OF FABRICATING RUTHENIUM-BASED CONTACT PLUG FOR MEMORY DEVICES

(75) Inventors: Bor-Bu Sheu; Chung-Ming Chu; Ming-Chung Chiang; Min-Chieh Yang; Wen-Chung Liu; Jong-Bor Wang; Pai-Hsuan Sun, all of Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/721,796

(22) Filed: Nov. 24, 2000

(51) Int. Cl.[7] .......................................... H01L 21/8242
(52) U.S. Cl. .................. 438/240; 438/399; 438/650; 438/688
(58) Field of Search .................... 438/240, 3, 238–241, 438/250–256, 381, 394–399, 675, 672, 650, 688; 247/295, 298, 297

(56) References Cited
U.S. PATENT DOCUMENTS 5,998,225 A * 12/1999 Crenshaw et al. ............. 438/3
6,156,599 A * 5/2000 Aoyama et al. ............ 438/238

* cited by examiner

Primary Examiner—Tuan H. Nguyen
Assistant Examiner—Yennhu B. Huynh
(74) Attorney, Agent, or Firm—W. Wayne Liauh

(57) ABSTRACT

A method for fabricating semiconductor memory cells such as dynamic random access memory (DRAM) and ferroelectric random access memory (FRAM) with improved contact between the capacitor electrode and the underneath device area. It includes the following main steps of: (1) forming a first dielectric layer on a wafer surface; (2) forming at least one through opening in the first dielectric layer; (3) forming a ruthenium based plug in the through opening; and (4) forming a capacitor in contact with the ruthenium based plug. The ruthenium based plug can be made of ruthenium metal, conductive ruthenium oxide, or a stack of conductive ruthenium oxide and ruthenium metal. The method allows the memory cell to be made without the need for a barrier, which is required to protect the storage electrode from reacting with Si atoms during the fabrication process.

20 Claims, 3 Drawing Sheets

METHOD OF FABRICATING RUTHENIUM-BASED CONTACT PLUG FOR MEMORY DEVICES

FIELD OF THE INVENTION

The present invention relates to an improved memory device and method of fabricating the same. More specifically, the present invention relates to a method for improving the contact mechanism between the storage node and the device area of memory devices such as dynamic random access memory (DRAM) and ferroelectric random access memory (FRAM), as well as the improved memory cells so fabricated. The method disclosed in the present invention eliminates the need for an additional barrier layer, which is typically required in order to prevent the deterioration of the contact structure between the conventional metal plug and the poly-silicon (poly-Si) plug, or between the conventional metal plug and the silicon (Si) devices.

BACKGROUND OF THE INVENTION

A semiconductor memory cell, such as dynamic random access memory (DRAM) or ferroelectric random access memory (FRAM), contains a storage node(including an electrode of a capacitor), which is in contact with the device area. Providing an appropriate contact mechanism between the capacitor storage node and the device area is a critical consideration in the integration of ferroelectric or high dielectric constant perovskite ($CaTiO_3$) films into the semiconductor memory devices.

Typically, the electrode materials for use in preparing the capacitor storage node require the presence of certain barriers which can block the diffusion of the perovskite elements and/or elements from the Si-devices and prevent interactions between these components. Several prior art references have discussed the difficulties during the process of integrating of a BST capacitor, which contains (Ba, Sr)$TiO_3$, due to the fact that all the electrode materials (such as Pt, Ru, Ir, and conducting oxides thereof) require a certain barrier layer at their interface with the Si-plug, which connects the capacitor with the cell transistor. Binary or ternary refractory metal nitrides (such as TiN, TiSiN, TiAlN, etc), are used to protect the storage electrode from reacting with Si atoms during the steps of BST film deposition, high temperature annealing, and insulating layer deposition. This has been discussed in, for example, U.S. Pat. No. 5,998,225.

The conventional stack of barrier/electrode is prone to oxidation during the BST deposition because of the exposure of the sidewall area to the oxidizing atmosphere. When the barrier layer is buried in the contact plug, the sidewall of the barrier is not exposed to the oxidizing atmosphere, and the oxidation resistant property of the contact is improved. However, the buried barrier scheme has at least one shortcoming in that, if there is any displacement between the contact plug and the electrode, the barrier layer can still suffer from oxidation. Furthermore, with devices features at 0.13 $\mu$m and below, it becomes increasingly difficult to implement such a barrier layer, and there is no room for misalignment between the contact hole and the electrode.

The oxidation resistance of TiN or TiAlN is another concern when using either of these materials as the barrier layer between an $SrRuO_3$ electrode and a contact plug (either a metal plug or a poly-Si plug). It has been reported that TiAlN film exhibits a better oxidation resistance than the TiN film, and that the amount of aluminum (about 9%) included in the TiN film plays an important role in increasing the oxidation resistance by forming an $Al_2O_3$ layer at the top surface. However, the thickness of the Al-rich ($Al_2O_3$) layer usually needs to be greater than 20 nm. This can cause a capacitance of the integrated BST capacitor to be substantially reduced.

SUMMARY OF THE INVENTION

The primary object of the present invention is to develop an improved contact between the storage node of a memory cell with an associated device area without the need for a barrier layer. More specifically, the primary object of the present invention is to develop a method which provides an improved contact between a capacitor electrode and a semiconductor device (with or without a poly-Si plug), without the need for a barrier, which is required to protect the storage electrode from reacting with Si atoms during the fabrication process. As discussed above, the use of such a barrier layer can cause many undesirable problems such as oxidation, misalignment between the contact hole and the electrode, and degradation in the capacitance of the storage mode.

In the present invention, a Ru metal film or conductive $RuO_2$/Ru stacked film is used to form a plug, which provides the contact between the electrode of the capacitor and the poly-Si plug, or between the electrode of the capacitor and the semiconductor device area if no intermediate poly-Si plug is used. The implementation of such Ruthenium-based contact plug can prevent the deterioration of the metal plug (bottom electrode) caused by the underneath poly-Si plug or the Si device (if no such immediate poly-Si plug is present), thus it allows the memory device to be fabricated without the need for a barrier layer. As a result, the process of the present invention allows a better alignment between the contact hole and the electrode. Also, unlike the case of using an TiAlN barrier, the method of the present invention does not involve an insulative $Al_2O_3$ layer, thus, no degradation of the total capacitance of the integrated ferroelectric or high dielectric constant capacitor will be incurred.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved contact mechanism provided between the storage node of a memory cell and an associated device area or a poly-Si plug, without the need for a barrier layer, which is required to protect the storage electrode from reacting with Si atoms during the fabrication process. As discussed above, the use of such a barrier layer often is the cause of the problems of oxidation, misalignment between the contact hole and the electrode, and/or degradation in the capacitance of the storage mode. Since the method disclosed in the present invention allows an improved contact mechanism between the capacitor electrode and the semiconductor device (with or without a poly-Si plug) to be achieved, without the need for a barrier, it also eliminates many of the problems associated with the presence of such a barrier layer.

In the present invention, a Ru metal film or conductive $RuO_2$/Ru stacked film is used to form a plug, which provides the contact between the electrode of the capacitor and the poly-Si plug, or between the electrode of the capacitor and the semiconductor device if no intermediate poly-Si plug is used. The implementation of such Ruthenium-based contact plug can prevent the deterioration of the metal plug (bottom electrode) caused by the underneath of the poly-Si plug or the Si device (if no such immediate poly-Si plug is present), thus it allows the memory device to be fabricated without the need for a barrier layer. As a result, the process of the present invention allows a better alignment between the contact hole and the electrode. Also, unlike the case of an TiAlN barrier, the method of the present invention does not involve an insulative $Al_2O_3$ layer, thus, no degradation of the total capacitance of the integrated ferroelectric or high dielectric constant capacitor will be incurred.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 1:
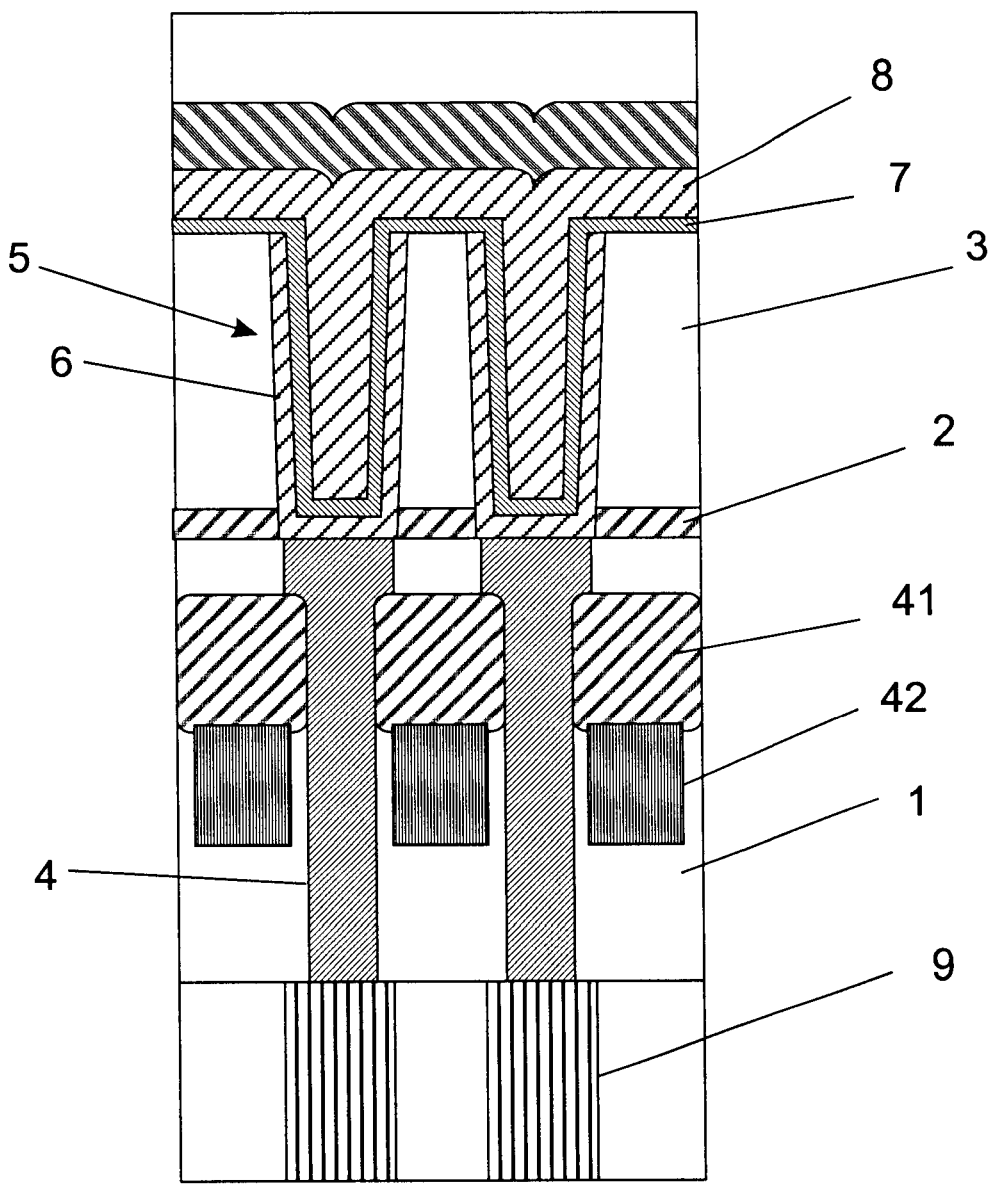
FIG. 1 is the first embodiment of the process disclosed in the present invention in which a concave-shaped DRAM capacitor is connected by the ruthenium-based connecting plug to the device area underneath.

FIG. 1 shows the first embodiment of the process disclosed in the present invention in which a concave-shaped DRAM capacitor is connected by the ruthenium-based connecting plug to the device area underneath.

In fabricating the concave-shaped DRAM as shown in FIG. 1, a first insulating layer 1 made of a first insulating material ($SiO_2$) is formed on a semiconductor substrate. The first insulating layer 1 has a thickness of about 200 nm to 1,000 nm. A plurality of through openings 2, each having a diameter of 0.05 to 0.15 $\mu$m, are formed in the first insulation layer in one single lithography and etching process. Then, a plurality of ruthenium-based plugs 4 are formed in the openings of the first insulating layer, with the top surface of the plugs substantial co-planar relative to the top surface of the first insulating layer 1.

A second insulating layer 2 made of a second insulating material (etching top layer, such as SiN, oxy-silicon nitride) different from the first insulating material is formed on top of the first insulating layer and the ruthenium-based plugs, having a thickness of 10 nm to 100 nm. Thereafter, a third insulating layer 3 made of a third insulating material (e.g., $SiO_2$), which is different from the second insulating but can be the same as the first insulating material, is formed on top of the second insulating layer, having a thickness of about 300 nm to 800 nm.

A plurality of concave openings 5 are formed in the third and second insulating layers, each with a size of 0.1–0.18 $\mu$m×0.2–0.45 $\mu$m and an inside wall angle of between 80 and 90 degrees. The concave openings 5 stop at the first insulating layer 1 and the ruthenium plug 4 in one single lithography and etching process. Then a plurality of capacitor storage node electrode layers (or bottom electrodes) 6 are respectively formed inside the concave openings 5. The electrode layers 6 are made of noble metals (e.g., Pt, Ir, or Ru), conductive metal oxides (e.g., $RuO_2$, or $IrO_2$), or perovskite metal oxides (e.g., $SrRuO_3$). The concave storage nodes 6 are separated by planarization techniques (such as chemical-mechanical polishing or reactive ion etching), and each of the concave storage nodes 6 is contacted by a corresponding ruthenium plug 4.

After the concave storage nodes 6 are formed, a high dielectric constant capacitor insulating layer (e.g., $Ta_2O_5$, $SrTiO_3$, or $BaSrTiO_3$) 7 having a thickness of about 5 nm to 40 nm, is formed on the concave storage nodes 6. Finally, a capacitor upper-electrode 8 (e.g., noble metals like Pt, Ir, Ru, or metal oxides such as $SrRuO_3$, $IrO_2$, or $RuO_2$) having a thickness of about 20 nm to 100 nm is formed on the high dielectric constant capacitor insulating layer. This completes the formation of the concave-shaped capacitor whose bottom electrode is connected to a poly-Si plug 9 via a ruthenium plug. As discussed above, the ruthenium plug can be connected directly to a semiconductive device without the poly-Si plug. FIG. 1 also shows tungsten plugs 41 and $SiN_x$ layer 42.

EXAMPLE 2

Figure 2:
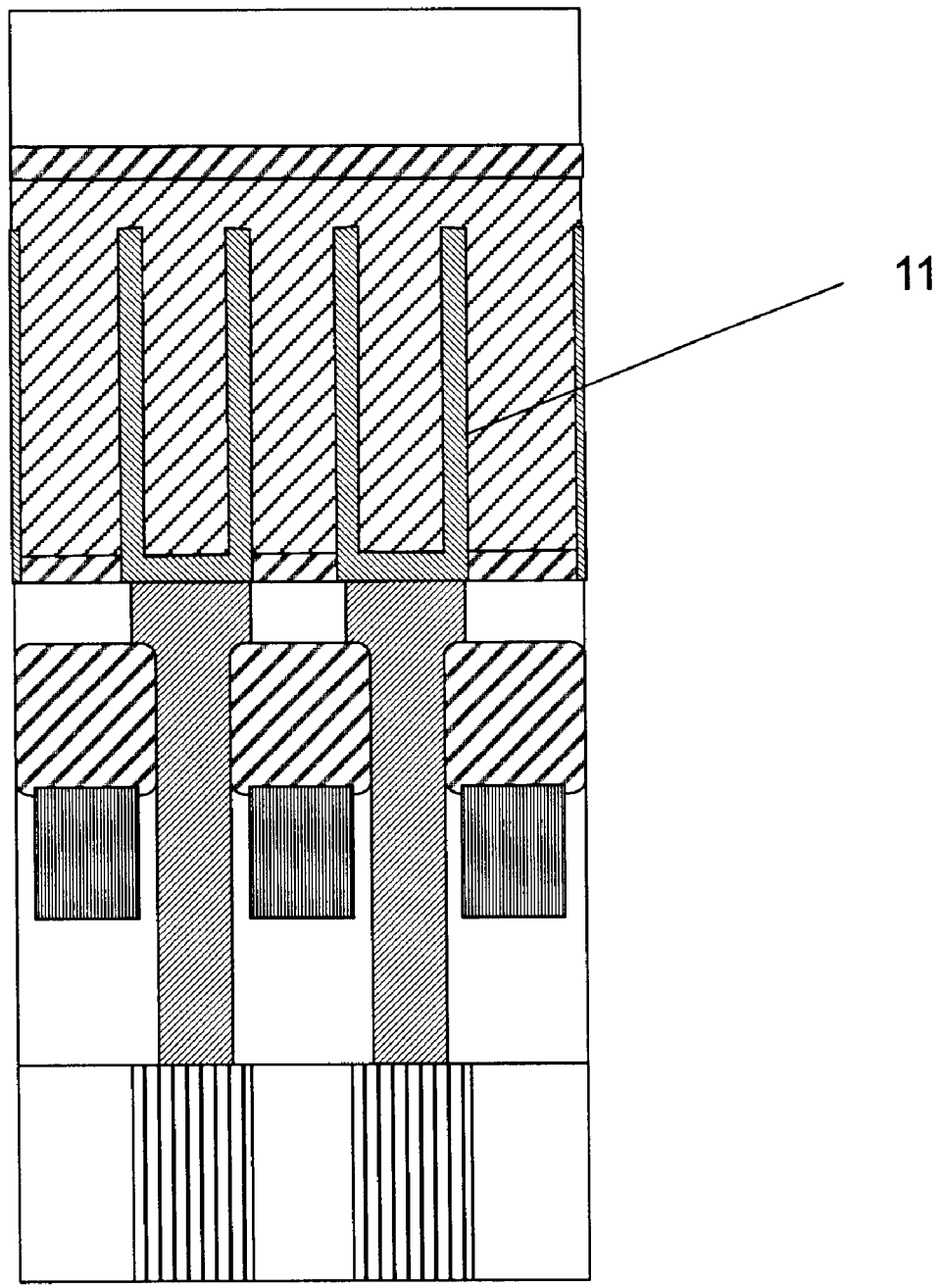
FIG. 2 is the second embodiment of the process disclosed in the present invention in which a cylinder-shaped DRAM capacitor is connected by the ruthenium-based connecting plug to the underneath device area.

FIG. 2 is the second embodiment of the process disclosed in the present invention in which a cylinder-shaped DRAM capacitor is connected by the ruthenium-based connecting plug to the underneath device area. The DRAM capacitor includes a plurality of cylindrically shaped storage nodes 11.

EXAMPLE 3

Figure 3:
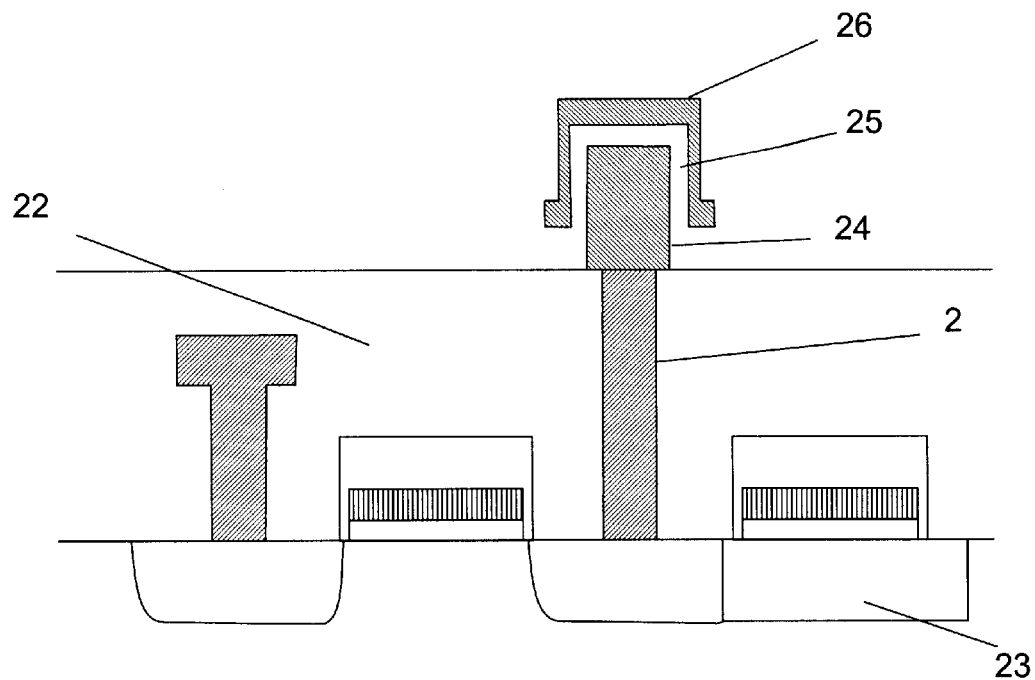
FIG. 3 is the third embodiment of the process disclosed in the present invention in which a pedestal-shaped storage node is connected by the ruthenium-based connecting plug to the underneath device area in a high-density FRAM cell.

FIG. 3 is the third embodiment of the process disclosed in the present invention in which a pedestal-shaped storage node is connected by the ruthenium-based connecting plug to the underneath device area in a high-density FRAM cell. FIG. 3 shows a Ru plug 21 formed in a dielectric layer 22, an isolation 23, a bottom electrode 24, a ferroelectric element 25, and a top electrode 26.

EXAMPLE 4

Figure 4:
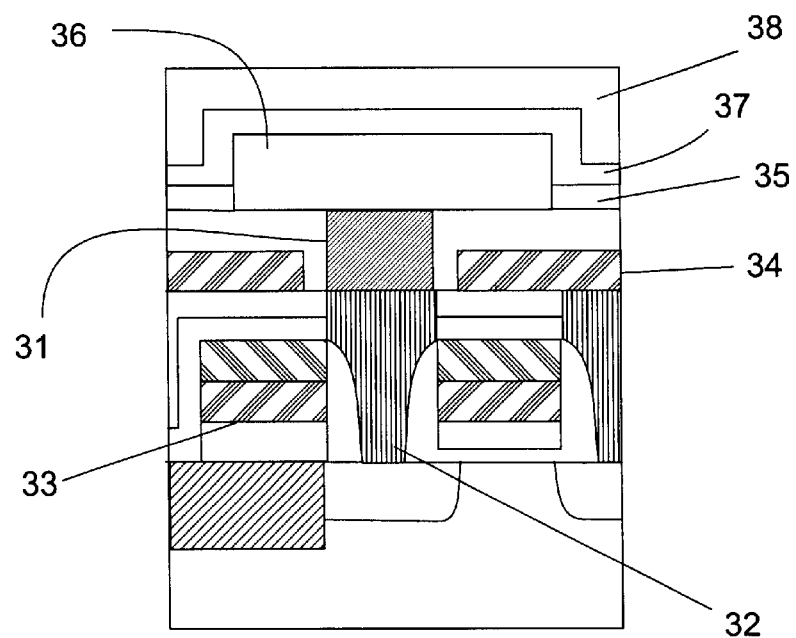
FIG. 4 is the fourth embodiment of the process disclosed in the present invention in which a pedestal-shaped storage node is connected to the ruthenium-based connecting plug sitting on a polycrystalline silicon (Poly-Si) plug.

FIG. 4 is the fourth embodiment of the process disclosed in the present invention in which a pedestal-shaped storage node is connected to the ruthenium-based connecting plug sitting on a polycrystalline silicon (Poly-Si) plug.

FIG. 4 shows a Ru plug 31, a poly-Si plug 32, a word line 33, a bit line 34, an SiN layer 35, a bottom electrode 36, a BST layer ((Ba, Sr)$TiO_3$) 37, and a plate electrode 38.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a semiconductor device containing a capacitor, comprising the steps of:

(a) forming a first dielectric layer on a wafer surface, said wafer including an electrically conductive device area;
(b) forming at least one through opening in said first dielectric layer, said through opening being in contact with said electrically conductive device area;
(c) forming a ruthenium based plug in said through opening, wherein said ruthenium based plug being made of ruthenium metal, conductive ruthenium oxide, or a stack of conductive ruthenium oxide and ruthenium metal; and
(d) forming a capacitor, said capacitor having a bottom electrode which is in contact with said ruthenium based plug so that said capacitor is electrically connected to said electrically conductive device area through said ruthenium based plug.

2. The method for fabricating a semiconductor device according to claim 1, which further comprises the step of forming a second dielectric layer on said first dielectric layer, said second dielectric layer being made of a different material from said first dielectric layer, and said through opening being formed through both said first and second dielectric layers.

3. The method for fabricating a semiconductor device according to claim 1, wherein said capacitor is a concaved-shaped capacitor.

4. The method for fabricating a semiconductor device according to claim 1, wherein said capacitor is a cylindrically-shaped capacitor.

5. The method for fabricating a semiconductor device according to claim 1, wherein said capacitor is a pedestal-shaped capacitor.

6. The method for fabricating a semiconductor device according to claim 5, wherein said pedestal-shaped capacitor contains a bottom electrode, a plate electrode, and a ferroelectric layer separating said bottom and plate electrodes.

7. The method for fabricating a semiconductor device according to claim 5, wherein said pedestal-shaped capacitor contains a bottom electrode, a plate electrode, and a BST layer ((Ba, Sr)TiO$_3$) separating said bottom and plate electrodes.

8. The method for fabricating a semiconductor device according to claim 1, wherein said capacitor contains a bottom electrode made of a material selected from the group consisting of noble metals, conductive metal oxides, and perovskite metal oxides.

9. The method for fabricating a semiconductor device according to claim 8, wherein said noble metal is Pt, Ir, or Ru.

10. The method for fabricating a semiconductor device according to claim 8, wherein said perovskite metal oxides is SrRuO$_3$.

11. A semiconductor memory device comprising:
(a) a first dielectric layer formed on a wafer surface, said wafer including an electrically conductive device area;
(b) at least one through opening formed in said first dielectric layer, said through opening being in contact with said electrically conductive device area;
(c) a ruthenium based plug formed in said through opening, wherein said ruthenium based plug being made of ruthenium metal, conductive ruthenium oxide, or a stack of conductive ruthenium oxide and ruthenium metal; and
(d) a capacitor, said capacitor having a bottom electrode in contact with said ruthenium based plug so that said capacitor is electrically connected to said electrically conductive device area through said ruthenium based plug.

12. The semiconductor memory device according to claim 11, which comprises a second dielectric layer formed on said first dielectric layer, said second dielectric layer being made of a different material from said first dielectric layer, and said through opening being formed through both said first and second dielectric layers.

13. The semiconductor memory device according to claim 11, wherein said capacitor is a concaved-shaped capacitor.

14. The semiconductor memory device according to claim 11, wherein said capacitor is a cylindrically-shaped capacitor.

15. The semiconductor memory device according to claim 11, wherein said capacitor is a pedestal-shaped capacitor.

16. The semiconductor memory device according to claim 15, wherein said pedestal-shaped capacitor contains a bottom electrode, a plate electrode, and a ferroelectric layer separating said bottom and plate electrodes.

17. The semiconductor memory device according to claim 15, wherein said pedestal-shaped capacitor contains a bottom electrode, a plate electrode, and a BST layer ((Ba, Sr)TiO$_3$) separating said bottom and plate electrodes.

18. The semiconductor memory device according to claim 11, wherein said capacitor contains a bottom electrode made of a material selected from the group consisting of noble metals, conductive metal oxides, and perovskite metal oxides.

19. The semiconductor memory device according to claim 18, wherein said noble metal is Pt, Ir, or Ru.

20. The semiconductor memory device according to claim 18, wherein said perovskite metal oxides is SrRuO$_3$.

* * * * *